United States Patent
Yu et al.

(10) Patent No.: US 8,699,255 B2
(45) Date of Patent: Apr. 15, 2014

(54) MEMORY ARRAY WITH HIERARCHICAL BIT LINE STRUCTURE

(75) Inventors: Chien-An Yu, Taipei (TW); Yi-Fong Lin, New Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 39 days.

(21) Appl. No.: 13/436,980

(22) Filed: Apr. 1, 2012

(65) Prior Publication Data

US 2013/0258743 A1 Oct. 3, 2013

(51) Int. Cl.
G11C 5/06 (2006.01)

(52) U.S. Cl.
USPC .......................... 365/63; 365/230.03

(58) Field of Classification Search
USPC ............................... 365/63, 230.03
See application file for complete search history.

(56) References Cited

U.S. PATENT DOCUMENTS

| | | | |
|---|---|---|---|
| 5,610,871 A | 3/1997 | Hidaka | |
| 5,715,189 A | 2/1998 | Asakura | |
| 5,815,428 A * | 9/1998 | Tsuruda et al. | 365/63 |
| 6,084,816 A | 7/2000 | Okamura | |
| 6,456,521 B1 | 9/2002 | Hsu | |
| 6,707,700 B2 | 3/2004 | Kang | |
| 6,839,267 B1 | 1/2005 | Poechnueller | |
| 2002/0085405 A1 | 7/2002 | Mueller | |
| 2004/0223392 A1 * | 11/2004 | Ikehashi | 365/205 |
| 2006/0097304 A1 | 5/2006 | Yoon | |
| 2007/0217261 A1 * | 9/2007 | Sadakata | 365/185.13 |
| 2007/0252196 A1 | 11/2007 | Kim | |
| 2008/0048241 A1 * | 2/2008 | Fujiwara et al. | 257/315 |
| 2009/0231904 A1 * | 9/2009 | Miyamoto | 365/145 |
| 2009/0300275 A1 * | 12/2009 | Murakami et al. | 711/103 |
| 2010/0027366 A1 * | 2/2010 | Kouno et al. | 365/226 |
| 2010/0329019 A1 * | 12/2010 | Mukunoki | 365/185.18 |
| 2011/0208904 A1 * | 8/2011 | Fujito et al. | 711/103 |
| 2011/0217818 A1 | 9/2011 | Lung | |
| 2012/0099384 A1 * | 4/2012 | Shinoda | 365/189.03 |

FOREIGN PATENT DOCUMENTS

| | | |
|---|---|---|
| JP | H08236714 A | 9/1996 |
| JP | 200317585 A | 1/2003 |
| JP | 2005303108 A | 10/2005 |
| JP | 2011118998 A | 6/2011 |
| JP | 201289206 A | 5/2012 |
| KR | 100147708 B1 | 11/1998 |

OTHER PUBLICATIONS

Krzysztof Iniewski, CMOS Processors and Memories, Springer, Aug. 2010, cover page, p. 308-309, Canada.

* cited by examiner

*Primary Examiner* — Michael Tran
(74) *Attorney, Agent, or Firm* — Winston Hsu; Scott Margo

(57) ABSTRACT

A memory array includes a plurality of word lines extending along a first direction; a plurality of memory cells coupled to a first sub-bit line (SBL) extending along a second direction that is substantially orthogonal to the first direction; a first selector region disposed substantially in the middle of the first SBL thereby dividing the plurality of memory cells into two sub-groups, wherein the first selector region comprises at least one selector transistor that is coupled to the first SBL; and a main bit line (MBL) extending along the second direction and coupled to the selector transistor.

13 Claims, 7 Drawing Sheets

Double selectors

Selector in middle

Multi selectors

MEMORY ARRAY WITH HIERARCHICAL BIT LINE STRUCTURE

BACKGROUND OF THE INVENTION

1. Field of the Invention

The present invention relates generally to the field of semiconductor devices. More particularly, the present invention relates to a memory cell array with hierarchical bit line structure.

2. Description of the Prior Art

Hierarchical bit line architecture has been applied to achieve high-speed operation. For example, U.S. Pat. No. 6,456,521 to Hsu et al. discloses a hierarchical bit line DRAM architecture system having a DRAM array which includes master and local bit lines, wherein each master bit line couples to two local bit lines.

U.S. Pat. No. 6,084,816 discloses a memory cell array divided into an odd number of sub-arrays. U.S. Pat. No. 6,084,816 further discloses word lines comprising an upper word line portion with low resistivity arranged in parallel with a lower word line portion which forms the gate of the cell transistor.

SUMMARY OF THE INVENTION

According to one aspect, the invention provides a memory array including a plurality of word lines extending along a first direction; a plurality of memory cells coupled to a first sub-bit line (SBL) extending along a second direction that is substantially orthogonal to the first direction; a first selector region disposed substantially in the middle of the first SBL thereby dividing the plurality of memory cells into two sub-groups, wherein the first selector region comprises at least one selector transistor that is coupled to the first SBL; and a main bit line (MBL) extending along the second direction and coupled to the selector transistor.

According to another aspect, the invention provides a memory array including a plurality of word lines extending along a first direction; a plurality of memory cells coupled to a sub-bit line (SBL) extending along a second direction that is substantially orthogonal to the first direction; a first selector region disposed substantially at one distal end of the SBL and coupled to the SBL; a second selector region disposed substantially at the other distal end of the SBL and coupled to the SBL; and a main bit line (MBL) extending along the second direction and coupled to the SBL via the first and second selector regions.

According to yet another aspect, the invention provides a memory array including a plurality of word lines extending along a first direction; a plurality of memory cells coupled to a first sub-bit line (SBL) extending along a second direction that is substantially orthogonal to the first direction; a second SBL juxtaposed to the first SBL in a staggered manner; a first selector region disposed substantially at one distal end of the first SBL and coupled to the first SBL; a second selector region disposed substantially at the other distal end of the first SBL and coupled to the second SBL; a first main bit line (MBL) extending along the second direction and coupled to the first SBL via the first selector region; and a second MBL extending along the second direction and coupled to the second SBL via the second selector region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
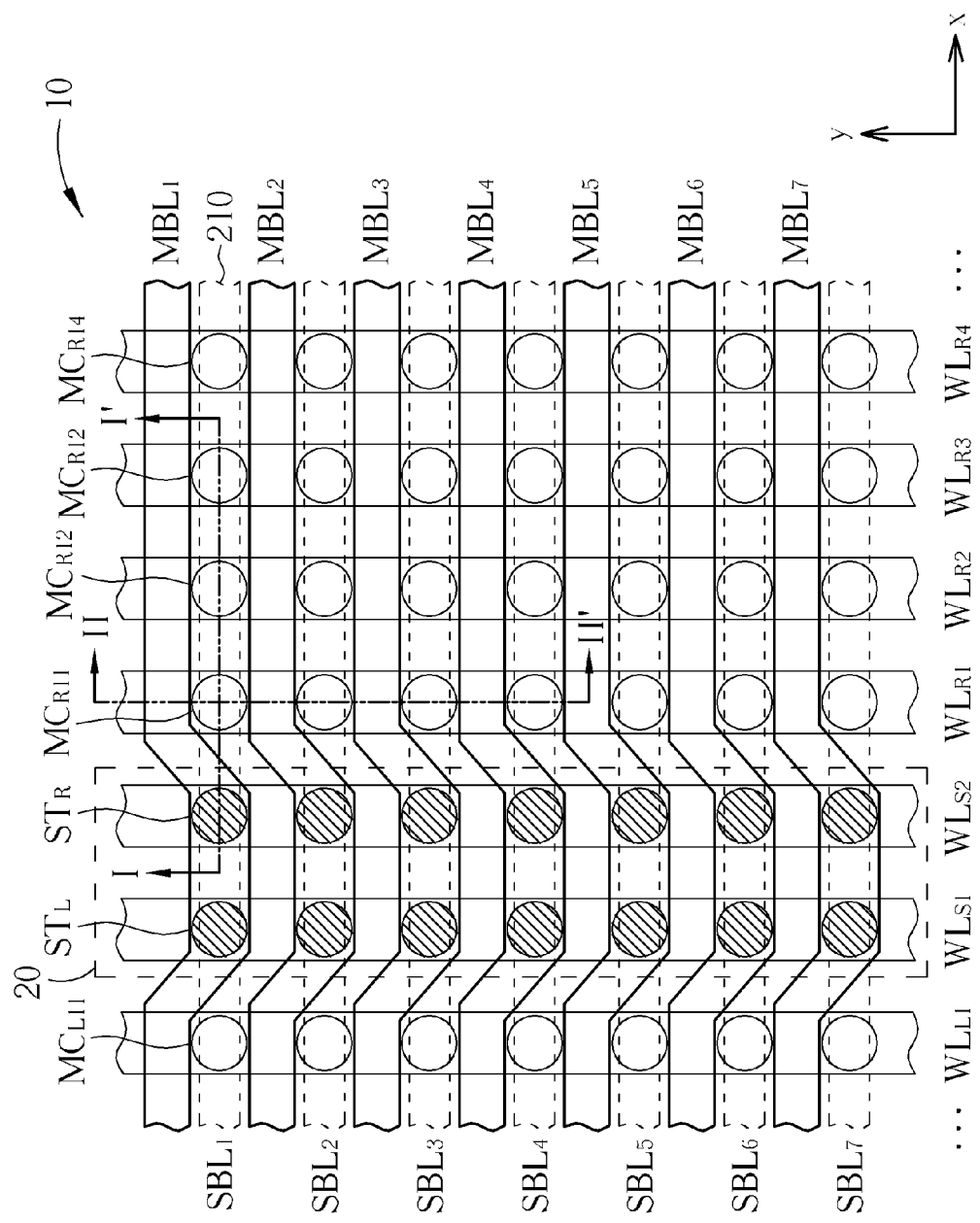
FIG. 1 is a schematic, partial top view of a memory array in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

With regard to the fabrication of transistors and integrated circuits, the term "major surface" refers to that surface of the semiconductor layer in and about which a plurality of transistors are fabricated. As used herein, the term "vertical" means substantially orthogonal with respect to the major surface. Typically, the major surface is along a <100> plane of a monocrystalline silicon layer on which the field-effect transistor devices are fabricated.

FIG. 1 shows the layout of a portion of the memory array 10 in a memory device according to one embodiment. The memory array 10 comprises a plurality of word lines extending generally in parallel along a first direction, e.g., the reference y-axis. For the sake of simplicity, only some of the word lines (e.g., $WL_{L1}$, $WL_{S1}$, $WL_{S2}$, $WL_{R1}$, $WL_{R2}$, $WL_{R3}$ and $WL_{R4}$) of the memory array 10 are demonstrated in FIG. 1. The word lines may be divided into two sub-groups by a selector region 20. At least one selector transistor is provided within the selector region 20. It is to be understood that although two selector transistors (e.g., $ST_L$ and $ST_R$) are shown, it is possible to use single one selector transistor or more than two selector transistors in the selector region 20. In FIG. 1, world lines (e.g., $WL_{R1}$, $WL_{R2}$, $WL_{R3}$ and $WL_{R4}$) on the right side of the selector transistor $ST_R$ are arranged in one sub-group, while the word lines (e.g., $WL_{L1}$) on the left side of the selector transistor $ST_L$ are arranged in the other sub-group. The word lines $WL_{S1}$, $WL_{S2}$ control the selector transistors $ST_L$ and $ST_R$ respectively.

The memory array 10 further comprises a plurality of memory cells MC (e.g., $MC_{L11}$, $MC_{R11}$, $MC_{R12}$, $MC_{R13}$ and $MC_{R14}$) and a plurality of sub-digit lines (or sub-bit lines, or also referred to as segmented digit lines) SBL (indicated by dashed outline 210). Each of the memory cells may have a cell size of 4 $F^2$. The sub-digit lines (e.g., $SBL_1 \sim SBL_7$) extend generally in parallel along a second direction, e.g., the reference x-axis. Each of the memory cells comprises a capacitor that is connected by a transistor to one of the sub-digit lines (or sub-bit lines) SBL. The transistors of the memory cells in the same column may be activated by a corresponding word line WL. Likewise, the memory cells in the same row may also be divided into two sub-groups by the selector region 20. In FIG. 1, for example, memory cells (e.g., $MC_{R11}$, $MC_{R12}$, $MC_{R13}$ and $MC_{R14}$) on the right side of the selector region 20 are arranged in one sub-group, while the memory cells (e.g., $MC_{L11}$) on the left side of the selector region 20 are arranged in the other sub-group. According to the embodiment, the number of the memory cells in each sub-group may range between 50 and 150, for example, each of the sub-digit lines (e.g., $SBL_1 \sim SBL_7$) is coupled to a corresponding main bit line (or main digit line) MBL via the selector region 20, more specifically, via the selector transistors $ST_L$ and $ST_R$. In FIG. 1, for example, the sub-digit line $SBL_1$ is coupled to main bit line MBL1, the sub-digit line $SBL_2$ is coupled to main bit line $MBL_2$, and so on. According to the embodiment, each of the sub-digit lines is continuous within the selector region 20.

Still referring to FIG. 1, each main bit line MBL runs in parallel with the sub-digit line SBL along the second direction, i.e., the reference x-axis, and protrudes downwardly in a repeated pattern. The continuous main bit lines, which extend substantially between two sub-digit lines, have repeated downward jogs. Each main bit line MBL bends downwardly at the selector region 20 at an angle of about 45°, for example, with respect to the reference x-axis such that each main bit line intersects the selector transistors $ST_L$ and $ST_R$. According to the embodiment of the invention, the selector transistors $ST_L$ and $ST_R$ are vertical transistors fabricated into the major surface of a semiconductor substrate (not shown). Each selector transistor has a drain region that is electrically coupled to the corresponding main bit line and a source region that is electrically coupled to the corresponding sub-digit line. A vertical channel (not shown) is defined between the drain region and the source region. According to the embodiment, the main bit lines are disposed above the major surface of the semiconductor substrate, while the sub-digit lines are disposed or buried below the major surface of the semiconductor substrate.

Figure 2A:
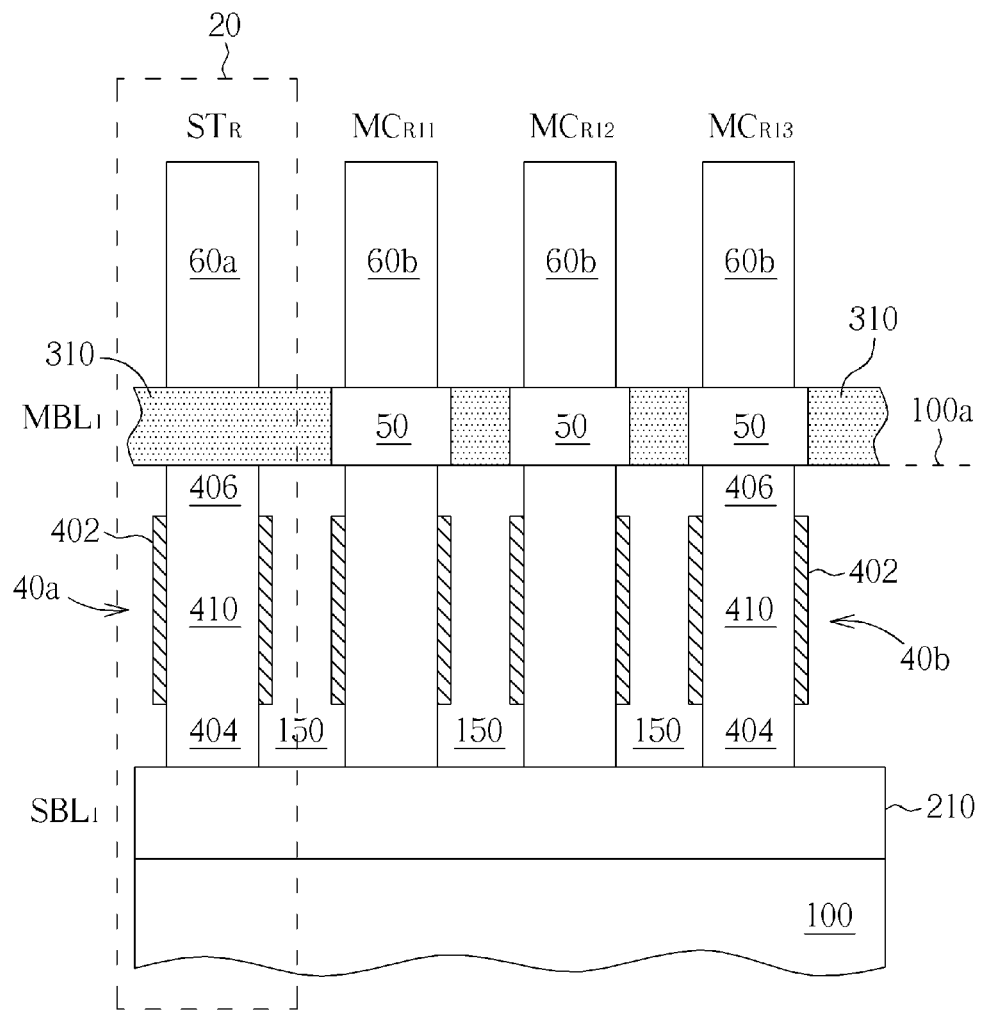
FIG. 2A and FIG. 2B are a schematic, cross-sectional views taken along lines I-I' and II-II' respectively in FIG. 1.
Figure 2B:
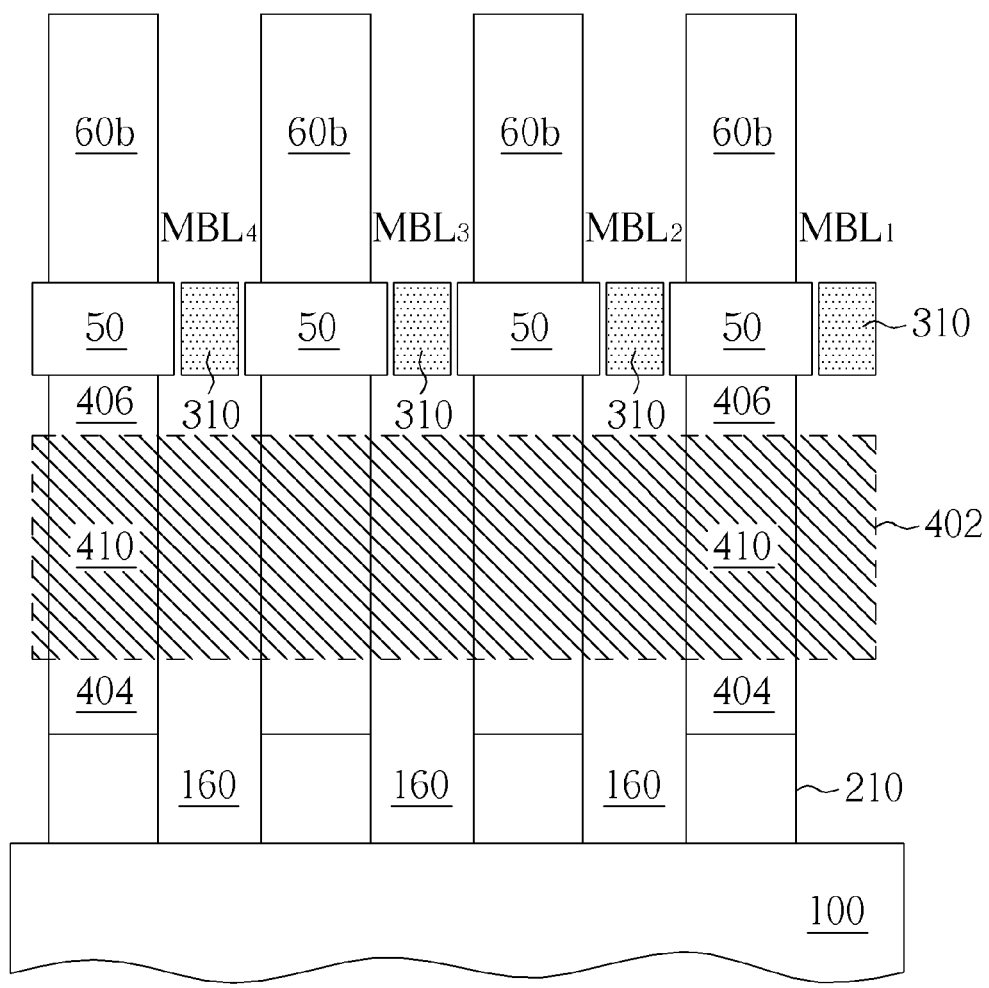

Please refer to FIGS. 2A and 2B concurrently. FIG. 2A and FIG. 2B are a schematic, cross-sectional views taken along lines I-I and II-II' respectively in FIG. 1. As shown in FIGS. 2A and 2B, a semiconductor substrate 100 is provided. The semiconductor substrate 100 has a major surface 100a. A plurality of vertical-channel transistors 40a and 40b are formed in the semiconductor substrate 100 under the major surface 100a. According to the embodiment, the vertical-channel transistors 40a and 40b are fabricated in respective silicon pillars 410 isolated from each other by isolation structures 150 and 160, wherein the vertical-channel transistor 40a is disposed within the selector region 20 and functions as the selector transistor as previously described. The vertical-channel transistor 40b, which is disposed outside the selector region 20, functions as an active switching component of each of the memory cells. The vertical-channel transistors 40a and 40b may have an identical structure and may comprise sidewall gates 402 (connected by respective word lines in FIG. 1), a source region 404 at a lower portion of each silicon pillar 410, and a drain region 406 at an upper portion of each silicon pillar 410. As previously mentioned, the drain region 406 of the vertical-channel transistor 40a is electrically coupled to the main bit line 310 and the source region 404 of the vertical-channel transistor 40a is electrically coupled to the sub-digit line 210. A capacitor structure 60b is disposed on each of the vertical-channel transistor 40b and is electrically coupled to the drain region 406 of each of the vertical-channel transistor 40b via a contact 50. A dummy capacitor structure 60a may be formed on the vertical-channel transistor 40a.

Figure 3A:
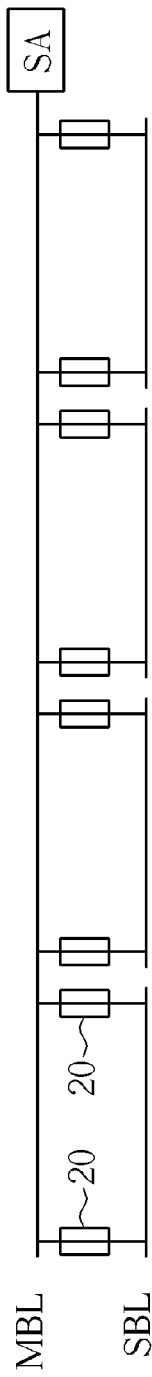
FIGS. 3A-3C are schematic diagrams showing the layouts of the MBL, SBL and the selector region according to embodiments of the invention.
Figure 3B:
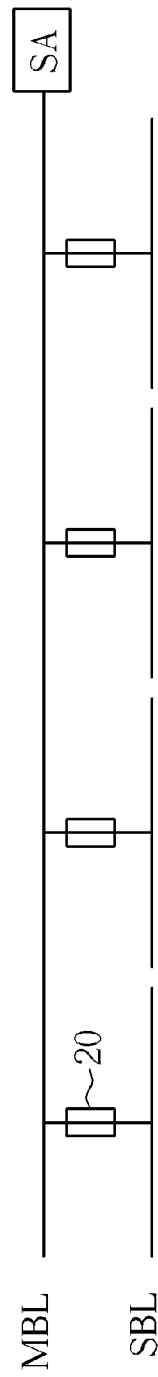
Figure 3C:
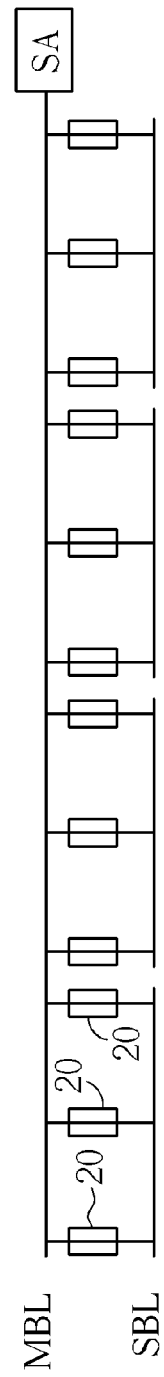

FIGS. 3A-3C are schematic diagrams showing the different layouts of the MBL, SBL (only four SBL sections are shown and word lines are ignored for simplicity) and the selector region 20 according to embodiments of the invention. The MBL may be coupled to a corresponding sense amplifier (SA). In FIG. 3B, the selector region 20 is disposed substantially in the middle of each SBL section. As previously mentioned, at least one selector transistor is provided in the selector region 20 and 50-150 memory cells may be coupled to the SBL section on either side of the selector region 20. The detailed structure of the selector transistor is described in FIGS. 2A and 2B. In FIG. 3A, two selector regions 20 are provided to couple with each SBL section on both ends. In FIG. 3C, three selector regions 20 are provided to couple with each SBL section on both ends as well as the middle portion. By providing such symmetric selector configuration, the bit line resistance can be reduced and signal margin on line end of each SBL section can be improved.

Figure 4:
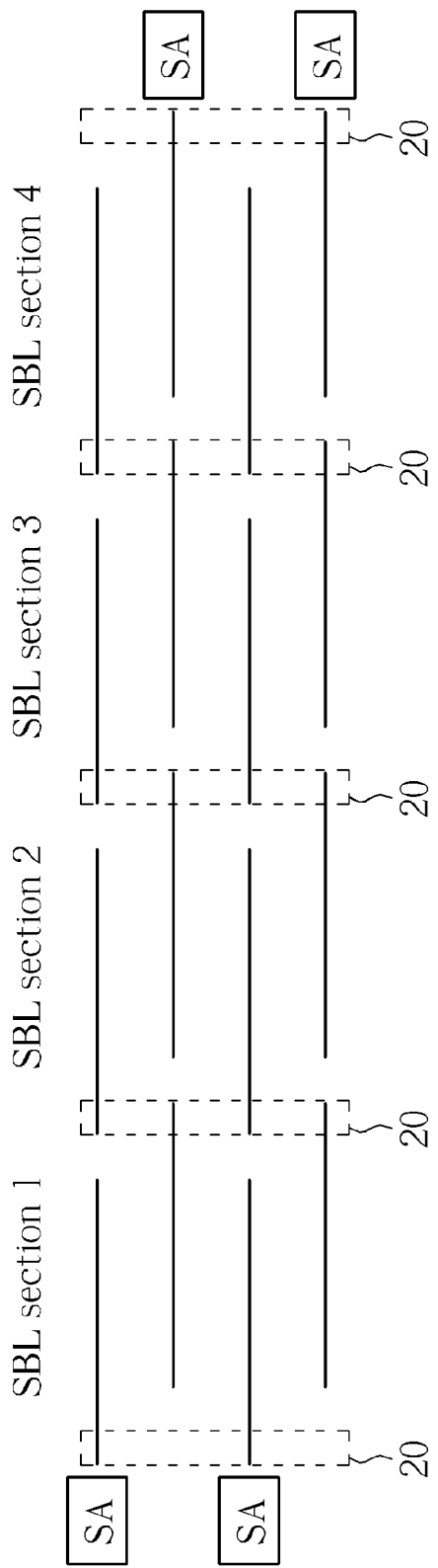
FIG. 4 shows an alternative layout for the SBL sections and the selector regions in accordance with another embodiment.

FIG. 4 shows an alternative layout for the SBL sections and the selector regions 20 in accordance with another embodiment. For the sake of simplicity, the main bit lines, the memory cells arranged along each SBL section, and the word lines coupled to the memory cells are not shown in the figure. As shown in FIG. 4, the SBL sections are arranged in a staggered manner and are alternately coupled to the corresponding selector regions 20 that are disposed at either end of the each of the SBL sections. The staggered SBL configuration as set forth in FIG. 4 alleviates the coupling effect that typically occurs between the adjacent SBL sections.

Figure 5:
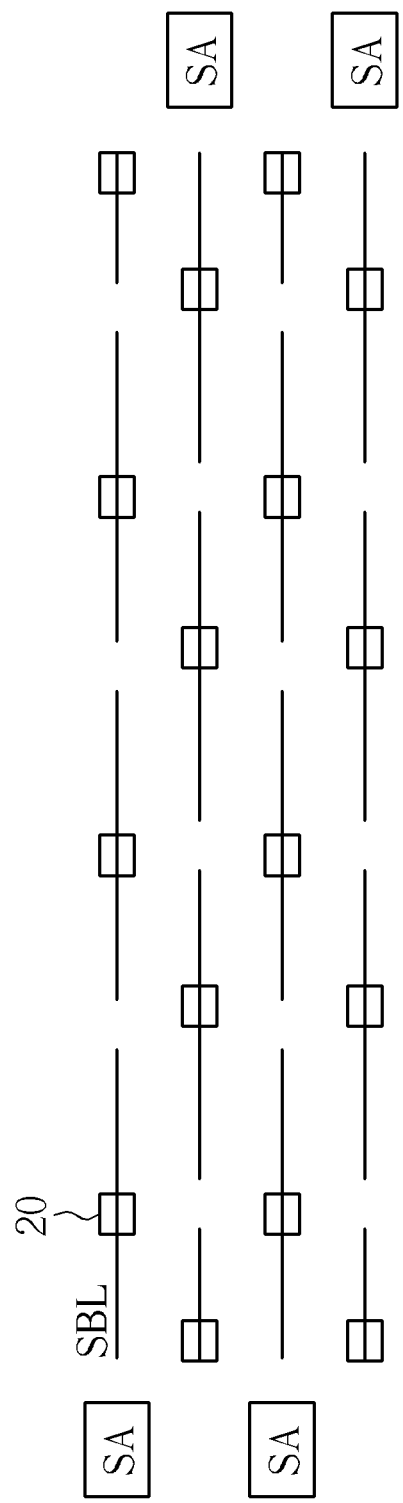
FIG. 5 shows a layout for the SBL sections and the selector regions in accordance with still another embodiment.

FIG. 5 shows a layout for the SBL sections and the selector regions 20 in accordance with still another embodiment. For the sake of simplicity, the main bit lines, the memory cells arranged along each SBL section, and the word lines coupled to the memory cells are not shown in the figure. As shown in FIG. 5, likewise, the SBL sections are arranged in a staggered manner. The selector region 20 is disposed substantially in the middle of each SBL.

Figure 6:
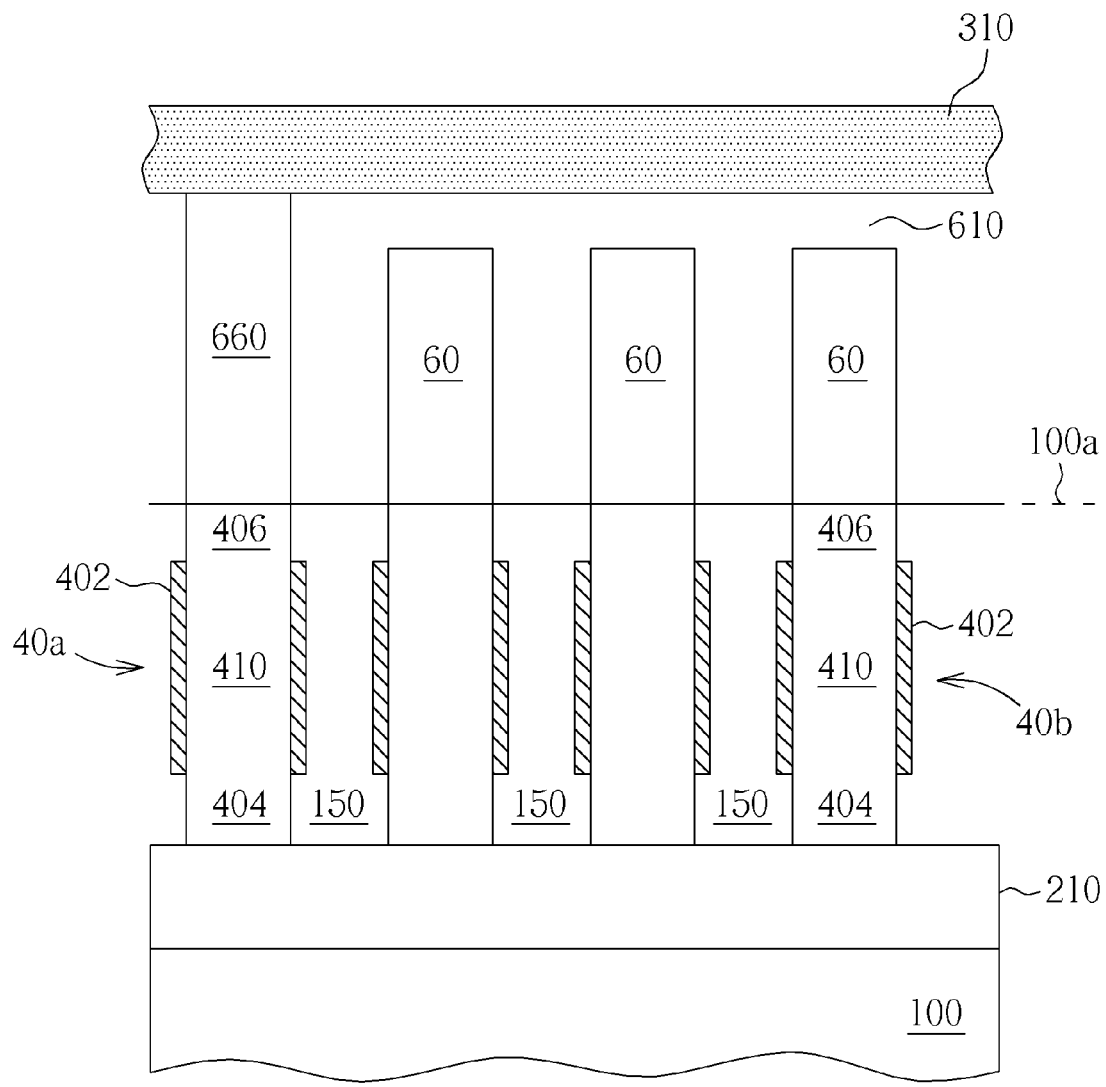
FIG. 6 shows another embodiment of memory array according to this invention.

FIG. 6 shows another embodiment of memory array according to this invention, wherein like numeral numbers designate like layers, regions or elements. As shown in FIG. 6, the main bit line 310 is located overlying the capacitor structures 60 and is insulated from the capacitor structures 60 by at least a dielectric film 610. The main bit line 310 is electrically connected to the vertical-channel transistor 40a through a selector contact 660.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array, comprising:
   a plurality of word lines extending along a first direction;
   a plurality of memory cells coupled to a first sub-bit line (SBL) extending along a second direction that is substantially orthogonal to the first direction;
   a first selector region disposed substantially in the middle of the first SBL thereby dividing the plurality of memory cells into two sub-groups, wherein the first selector region comprises at least one selector transistor that is coupled to the first SBL, wherein the selector transistor is a vertical-channel selector transistor; and
   a main bit line (MBL) extending along the second direction and coupled to the selector transistor, wherein the MBL bends at the first selector region to thereby intersect the selector transistor.

2. The memory array according to claim 1 wherein the first SBL is coupled to a source region of the selector transistor and the MBL is coupled to a drain region of the selector transistor.

3. The memory array according to claim 2 wherein the selector transistor further comprises a sidewall gate coupled to one of the plurality of word lines.

4. The memory array according to claim 1 further comprising a dummy capacitor structure on the MBL at the intersection.

5. The memory array according to claim 1 wherein the word lines and the first SBL are disposed below a major surface of a semiconductor substrate.

6. The memory array according to claim 5 wherein the MBL are disposed above the major surface of the semiconductor substrate.

7. The memory array according to claim 1 further comprising a second selector region disposed at one distal end of the first SBL.

8. The memory array according to claim 7 further comprising a third selector region disposed at the other distal end of the first SBL.

9. The memory array according to claim 1 further comprising a second SBL coupled to the MBL via a fourth selector region.

10. The memory array according to claim 1 wherein the MBL is situated under capacitor structures of the memory cells.

11. The memory array according to claim 1 wherein the MBL is situated above capacitor structures of the memory cells.

12. A memory array, comprising:
    a plurality of word lines extending along a first direction;
    a plurality of memory cells coupled to a sub-bit line (SBL) extending along a second direction that is substantially orthogonal to the first direction;
    a first selector region disposed substantially at one distal end of the SBL and coupled to the SBL;
    a second selector region disposed substantially at the other distal end of the SBL and coupled to the SBL; and
    a main bit line (MBL) extending along the second direction and coupled to the SBL via the first and second selector regions.

13. A memory array, comprising:
    a plurality of word lines extending along a first direction;
    a plurality of memory cells coupled to a first sub-bit line (SBL) extending along a second direction that is substantially orthogonal to the first direction;
    a second SBL juxtaposed to the first SBL in a staggered manner;
    a first selector region disposed substantially at one distal end of the first SBL and coupled to the first SBL;
    a second selector region disposed substantially at the other distal end of the-second SBL and coupled to the second SBL;
    a first main bit line (MBL) extending along the second direction and coupled to the first SBL via the first selector region; and
    a second MBL extending along the second direction and coupled to the second SBL via the second selector region.

* * * * *